(12) United States Patent
Chou

(10) Patent No.: US 8,742,818 B2
(45) Date of Patent: Jun. 3, 2014

(54) ADAPTIVE CLOCK SIGNAL GENERATOR WITH NOISE IMMUNITY CAPABILITY

(71) Applicant: Alchip Technologies, Ltd., Taipei (TW)

(72) Inventor: Fang-Ting Chou, Taipei (TW)

(73) Assignee: Alchip Technologies, Ltd., Taipei (TW)

( * ) Notice: Subject to any disclaimer, the term of this patent is extended or adjusted under 35 U.S.C. 154(b) by 0 days.

(21) Appl. No.: 13/728,225

(22) Filed: Dec. 27, 2012

(65) Prior Publication Data

US 2013/0222032 A1    Aug. 29, 2013

(30) Foreign Application Priority Data

Feb. 23, 2012   (TW) ............................ 101105948 A

(51) Int. Cl.
*H03K 3/00* (2006.01)
*G06F 1/10* (2006.01)
(52) U.S. Cl.
CPC ........................................ *G06F 1/10* (2013.01)
USPC .......................................................... 327/291

(58) Field of Classification Search
USPC .......................................... 327/205, 291–299
See application file for complete search history.

(56) References Cited

U.S. PATENT DOCUMENTS

| 5,610,776 A * | 3/1997 | Oh .................................. 360/53 |
| 6,472,918 B1 | 10/2002 | Mosinskis et al. |
| 2013/0154992 A1 * | 6/2013 | Nascimento .................. 345/174 |

* cited by examiner

*Primary Examiner* — Sibin Chen
(74) *Attorney, Agent, or Firm* — Birch, Stewart, Kolasch & Birch, LLP

(57) ABSTRACT

An adaptive clock signal generator with noise immunity capability is disclosed, including a gain amplifier for processing an analog oscillation signal to generate an amplified signal; an adjustable Schmitt trigger, coupled with the gain amplifier, for generating a triggered signal according to the amplified signal; an output buffer, coupled with the adjustable Schmitt trigger, for generating a clock signal according to the triggered signal; and a noise detector coupled with the adjustable Schmitt trigger. The noise detector detects noise components of an input signal and enlarges the hysteresis window of the adjustable Schmitt trigger as the level of detected noise increases.

8 Claims, 7 Drawing Sheets

ADAPTIVE CLOCK SIGNAL GENERATOR WITH NOISE IMMUNITY CAPABILITY

CROSS-REFERENCE TO RELATED APPLICATIONS

This application claims the benefit of priority to Patent Application No. 101105948, filed in Taiwan on Feb. 23, 2012; the entirety of which is incorporated herein by reference for all purposes.

BACKGROUND

The present disclosure generally relates to a clock signal generator and, more particularly, to an adaptive clock signal generator with noise immunity capability.

In many communication devices or consumer electronic products, a circuit chip usually utilizes a clock slicer to convert an analog signal outputted from a crystal oscillator into a full swing square signal and utilizes the square signal as a clock signal so that circuit modules inside the circuit chip operate according to the clock signal. However, the traditional clock slicer is easily interfered by the noise in a voltage source, thereby deviating the duty cycle of the resulting square signal from an ideal value.

Traditionally, a differential circuit structure is typically utilized to reduce the interference on the clock signal caused by the noise. However, the differential circuit structure requires considerable power consumption and thus not suitable for many circuitry applications.

SUMMARY

In view of the foregoing, it can be appreciated that a substantial need exists for apparatuses that can reduce the interference on the clock signal caused by the noise while maintaining the energy utilization efficiency.

An example embodiment of an adaptive clock signal generator with noise immunity capability is disclosed comprising: a gain amplifier for processing an analog oscillation signal to generate an amplified signal; an adjustable Schmitt trigger, coupled with an output terminal of the gain amplifier, for generating a triggered signal according to the amplified signal; an output buffer, coupled with an output terminal of the adjustable Schmitt trigger, for generating a clock signal according to the triggered signal; and a noise detector coupled with the adjustable Schmitt trigger; wherein the noise detector is coupled with a first input signal, the noise detector detects noise components of the first input signal and enlarges a hysteresis window of the adjustable Schmitt trigger as detected noise components of the first input signal increases.

One of the advantages of the afore-mentioned adaptive clock signal generator is that the noise detector dynamically adjusts the size of the hysteresis window of the adjustable Schmitt trigger according to the noise level of the first input signal, thereby effectively avoiding the duty cycle of the clock signal outputted from the output buffer from being interfered by the noise of a voltage source terminal or a grounded terminal.

It is to be understood that both the foregoing general description and the following detailed description are example and explanatory only and are not restrictive of the invention, as claimed.

DETAILED DESCRIPTION

Reference will now be made in detail to embodiments of the invention, which are illustrated in the accompanying drawings.

The same reference numbers may be used throughout the drawings to refer to the same or like parts or components. Certain terms are used throughout the description and following claims to refer to particular components. As one skilled in the art will appreciate, a component may be referred by different names. This document does not intend to distinguish between components that differ in name but not in function. In the following description and in the claims, the term "comprise" is used in an open-ended fashion, and thus should be interpreted to mean "include, but not limited to . . . " Also, the phrase "coupled with" is intended to compass any indirect or direct connection. Accordingly, if this document mentioned that a first device is coupled with a second device, it means that the first device may be directly or indirectly connected to the second device through electrical connections, wireless communications, optical communications, or other signal connections with/without other intermediate devices or connection means.

As used herein, the term "and/or" includes any and all combinations of one or more of the associated listed items. In addition, the singular forms "a", "an", and "the" as used herein are intended to include the plural forms as well, unless the context clearly indicates otherwise.

Figure 1:
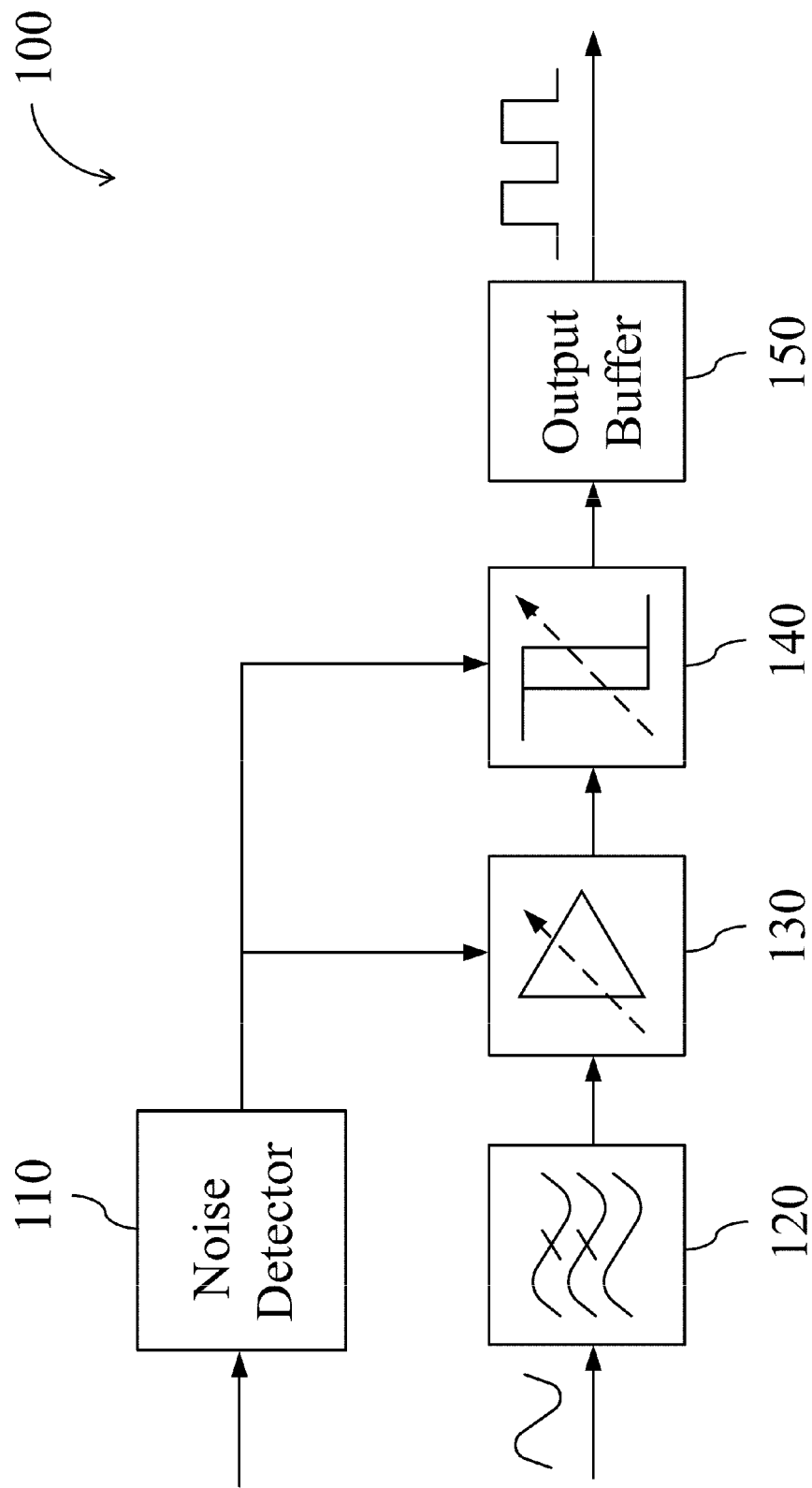
FIG. 1 is a simplified functional block diagram of an adaptive clock signal generator in accordance with an example embodiment.

Please refer to FIG. 1, which shows a simplified functional block diagram of an adaptive clock signal generator 100 in accordance with an example embodiment. As shown, the adaptive clock signal generator 100 comprises a noise detector 110, a filter 120, a gain amplifier 130, an adjustable Schmitt trigger 140, and an output buffer 150. When the noise detector 110 is coupled with a voltage source terminal or a grounded terminal, the noise detector 110 detects noise components in the signal received from the voltage source terminal or the grounded terminal. The filter 120 is utilized for filtering a signal outputted from an oscillation circuit (not shown) to generate an analog oscillation signal. The filter 120 may be designed to be a low-pass filter or a band-pass filter for different system requirements. The gain amplifier 130 is coupled with the filter 120 for processing the analog oscillation signal to generate an amplified signal. The adjustable Schmitt trigger 140 is coupled with an output terminal of the gain amplifier 130 to generate a triggered signal according to the amplified signal. The output buffer 150 is coupled with an output terminal of the adjustable Schmitt trigger 140 to generate a square clock signal according to the triggered signal.

In operations, the noise detector 110 dynamically adjusts the operation of the gain amplifier 130 and the operation of the adjustable Schmitt trigger 140 according to the detected noise level to maintain the duty cycle of the square wave outputted from the output buffer 150 in an ideal value and to avoid the presence of glitches in the square wave. The operation and implementation of the adaptive clock signal generator 100 will be further described below with reference to FIG. 2 to FIG. 4.

Figure 2:
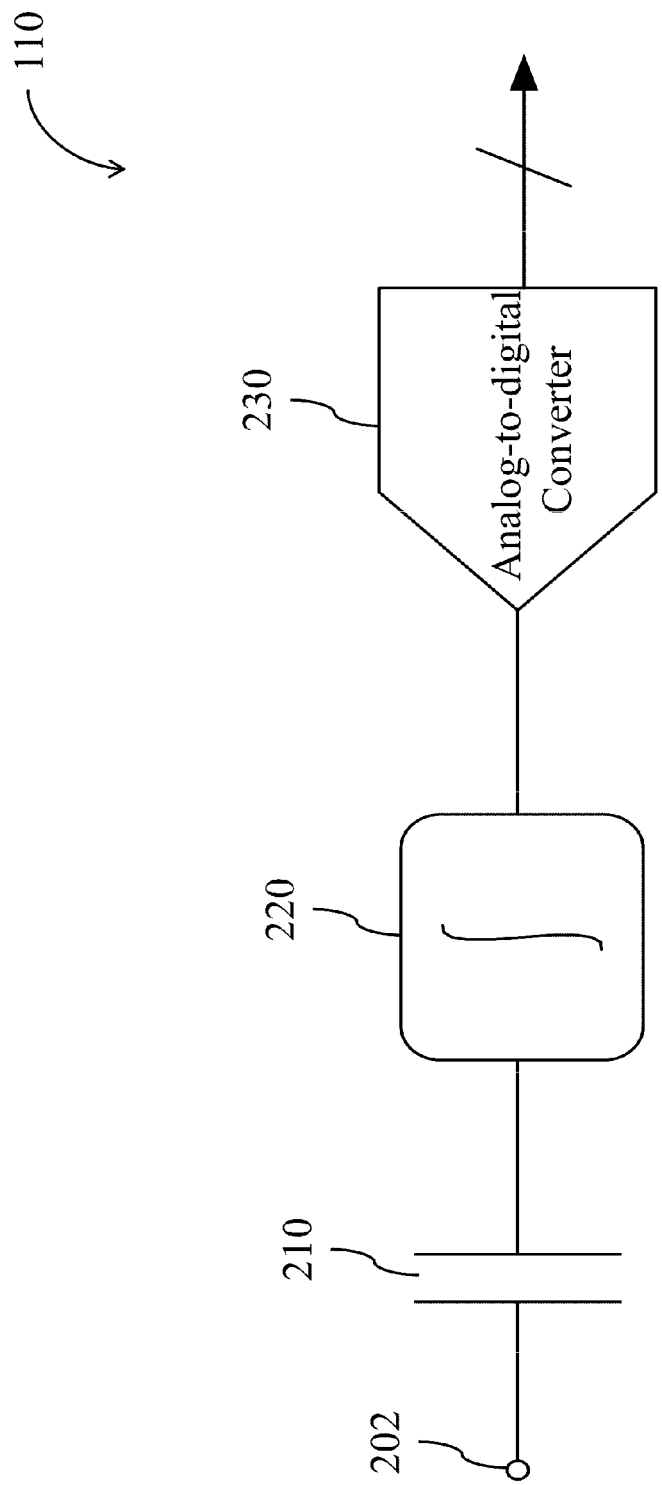
FIG. 2 is a simplified functional block diagram of a noise detector in FIG. 1 in accordance with an example embodiment.

FIG. 2 is a simplified functional block diagram of the noise detector 100 in accordance with an example embodiment. In this embodiment, the noise detector 110 comprises a capacitive device 210, a rectifier 220, and an analog-to-digital converter 230. When an input terminal 202 of the capacitive device 210 is coupled with the voltage source terminal or the grounded terminal, it extracts AC components of the signal received from the voltage source terminal or the grounded terminal. The rectifier 220 is coupled with the capacitive device 210 to generate a rectified signal according to an output signal of the capacitive device 210. The analog-to-digital converter 230 is coupled with the rectifier 220 to convert the rectified signal into a plurality of digital control codes S1, S2, . . . , Sn, wherein S1 represents the least significant bit (LSB) and Sn represents the most significant bit (MSB).

Figure 3:
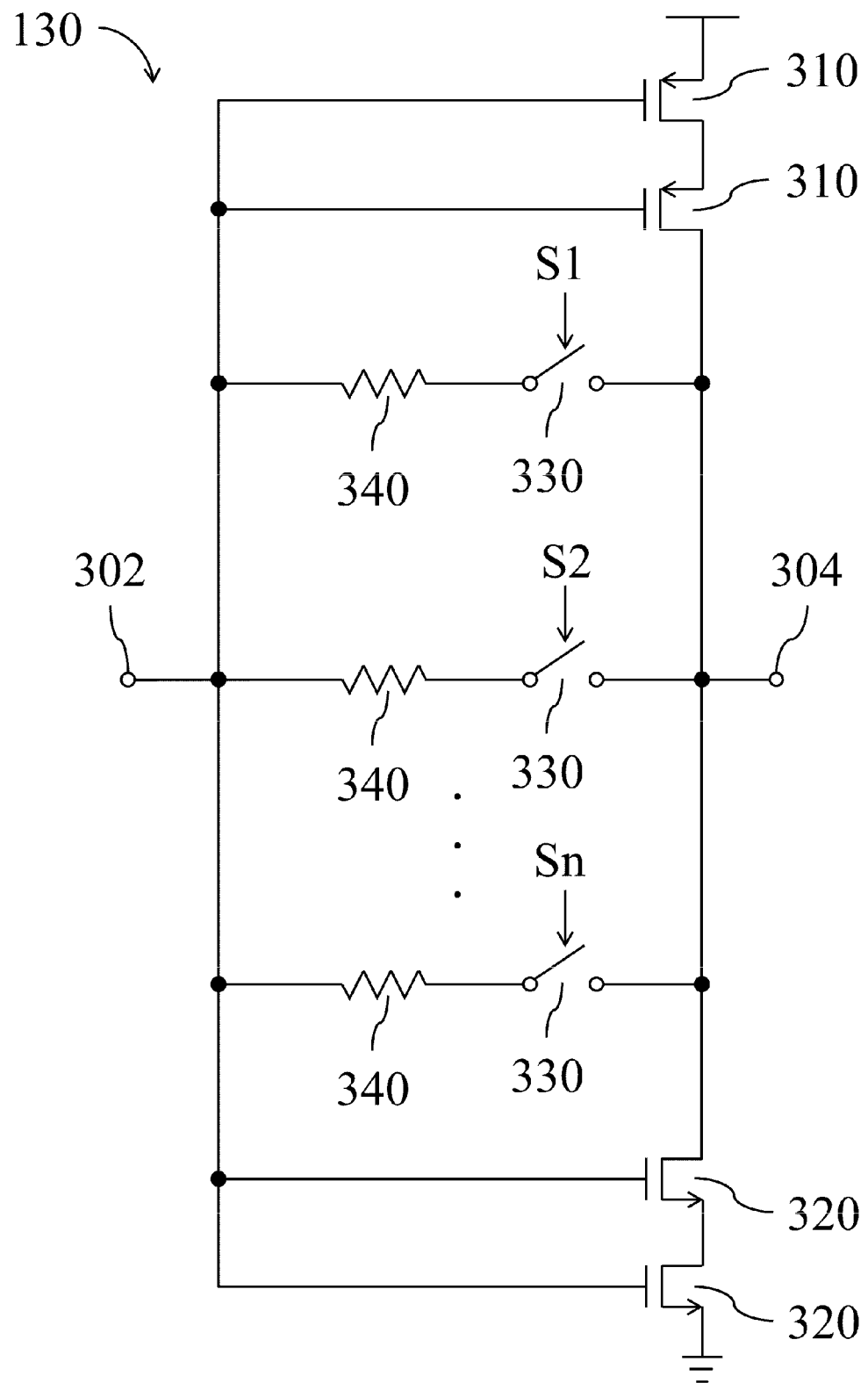
FIG. 3 is a simplified functional block diagram of a gain amplifier in FIG. 1 in accordance with an example embodiment.

FIG. 3 is a simplified functional block diagram of the gain amplifier 130 in accordance with an example embodiment. In this embodiment, the gain amplifier 130 comprises an input terminal 302, an output terminal 304, a plurality of serially-connected transistors 310, a plurality of serially-connected transistors 320, a plurality of switches 330 in parallel connections, and a plurality of resistors 340 in parallel connections. As shown in FIG. 3, the transistors 310 are coupled with a voltage source terminal and the transistors 320 are coupled with a fixed-voltage terminal, such as a grounded terminal. Control terminals of the transistor 310 are coupled with the input terminal 302 and one of the transistors 310 is coupled with the output terminal 304. Control terminals of the transistors 320 are coupled with the input terminal 302 and one of the transistors 320 is coupled with the output terminal 304. The switches 330 are respectively coupled between the input terminal 302 and the output terminal 304 and the resistors 340 are respectively coupled with the switches 330.

In operations, the noise detector 110 utilizes the digital control codes S1~Sn to respectively control the switches 330 in the gain amplifier 130 so as to change the gain of the gain amplifier 130.

Figure 4:
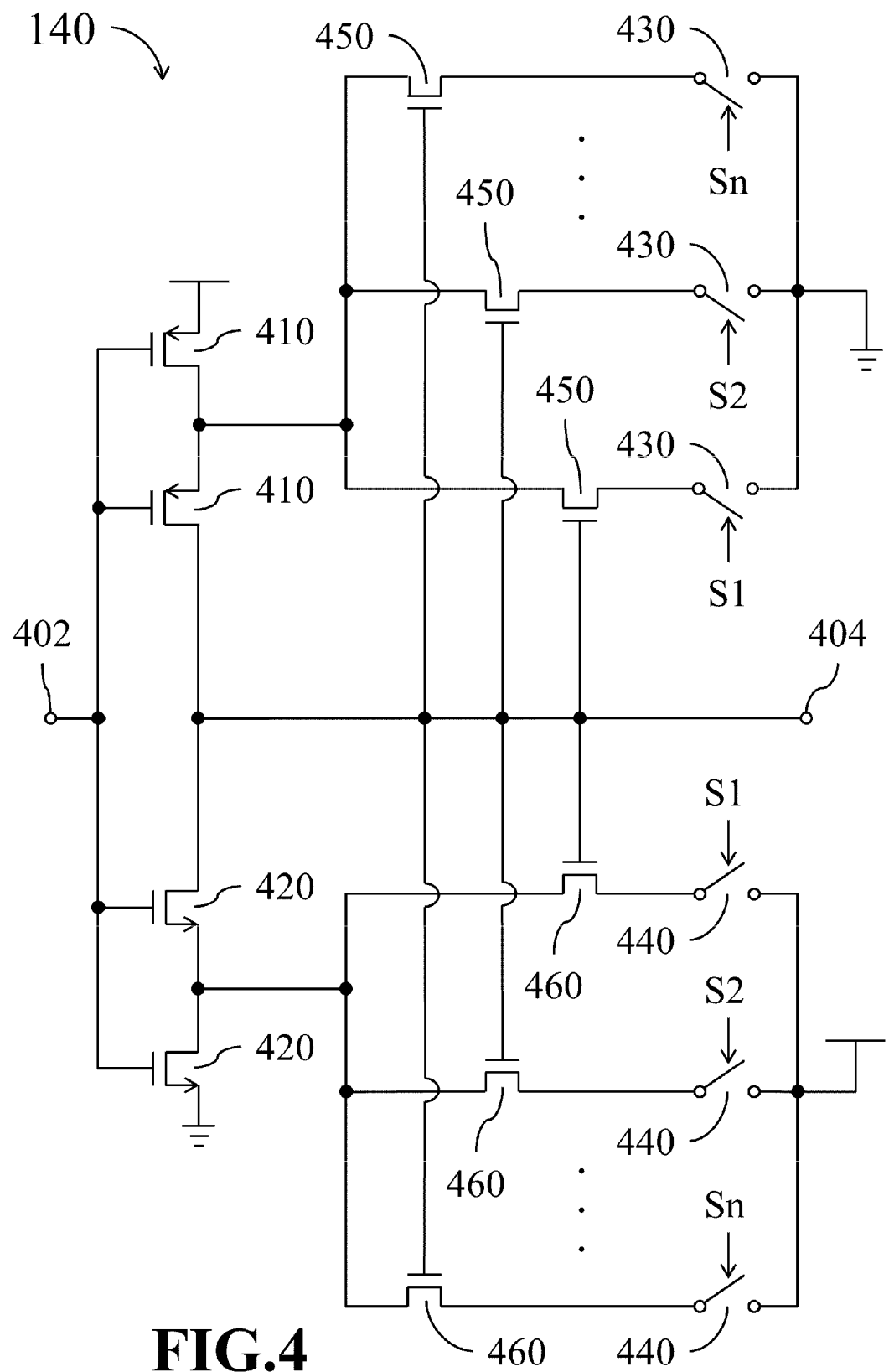
FIG. 4 is a simplified functional block diagram of an adjustable Schmitt trigger in FIG. 1 in accordance with an example embodiment.

FIG. 4 is a simplified functional block diagram of the adjustable Schmitt trigger 140 in accordance with an example embodiment. In this embodiment, the adjustable Schmitt trigger 140 comprises an input terminal 402, an output terminal 404, a plurality of serially-connected transistors 410, a plurality of serially-connected transistors 420, a plurality of switches 430 in parallel connections, a plurality of switches 440 in parallel connections, a plurality of resistors 450 in parallel connections, and a plurality of transistors 460 in parallel connections. As shown in FIG. 4, the transistors 410 are coupled with a voltage source terminal and the transistors 420 are coupled with a fixed-voltage terminal, such as a grounded terminal. Control terminals of the transistors 410 are coupled with the input terminal 402 and one of the transistors 410 is coupled with the output terminal 404. Control terminals of the transistors 420 are coupled with the input terminal 402 and one of the transistors 420 is coupled with the output terminal 404. The switches 430 are coupled between one of the transistors 410 and a fixed-voltage terminal, such as a grounded terminal. The switches 440 are coupled between one of the transistors 420 and a voltage source terminal. The transistors 450 are respectively coupled with the switches 430 and control terminals of the transistors 450 are coupled with the output terminal 404. The transistors 460 are respectively coupled with the switches 440 and control terminals of the transistors 460 are coupled with the output terminal 404.

In operations, the noise detector 110 utilizes the digital control codes S1~Sn to respectively control the switches 430 and the switches 440 in the adjustable Schmitt trigger 140 to change the threshold voltage of the adjustable Schmitt trigger 140, thereby changing the size of the hysteresis window of the adjustable Schmitt trigger 140.

In one embodiment, when the noise detector 110 detects that the noise level in the voltage source terminal or the grounded terminal decreases, the noise detector 110 adjusts the digital control codes S1~Sn to reduce the hysteresis window of the adjustable Schmitt trigger 140. When the noise detector 110 reduces the hysteresis window of the adjustable Schmitt trigger 140, the noise detector 110 adjusts the digital control codes S1~Sn to reduce the gain value of the gain amplifier 130. In the contrary, when the noise detector 110 detects that the noise level in the voltage source terminal or the grounded terminal increases, the noise detector 110 adjusts the digital control codes S1~Sn to enlarge the hysteresis window of the adjustable Schmitt trigger 140. When the noise detector 110 enlarges the hysteresis window of the adjustable Schmitt trigger 140, the noise detector 110 adjusts the digital control codes S1~Sn to increase the gain value of the gain amplifier 130 to improve the response speed of the entire circuitry.

As illustrated in the foregoing descriptions, the output buffer 150 generates a full swing square clock signal according to the triggered signal outputted from the adjustable Schmitt trigger 140. In implementations, the output buffer 150 may be realized by a plurality of serially-connected inverters to generate the required clock signal so that the clock signal has a 50% duty cycle. In an embodiment where the adaptive clock signal generator 100 is applied in a dual power source system, a level shifter may be added in the output buffer 150 to adjust the voltage of the clock signal to be suitable for subsequent stages.

Since the noise detector 110 dynamically adjusts the gain of the gain amplifier 130 and the size of the hysteresis window of the adjustable Schmitt trigger 140 according to the noise level in the signal received from the voltage source terminal or the grounded terminal, the swing and duty cycle of the clock signal outputted from the output buffer 150 would not be affected by the noise of the voltage source terminal or the grounded terminal. In addition, it also avoids the presence of glitches in the clock signal outputted from the output buffer 150. As a result, the noise immunity capability of the adaptive clock signal generator 100 can be greatly improved, thereby avoiding erroneous operations in the subsequent stages.

Figure 5:
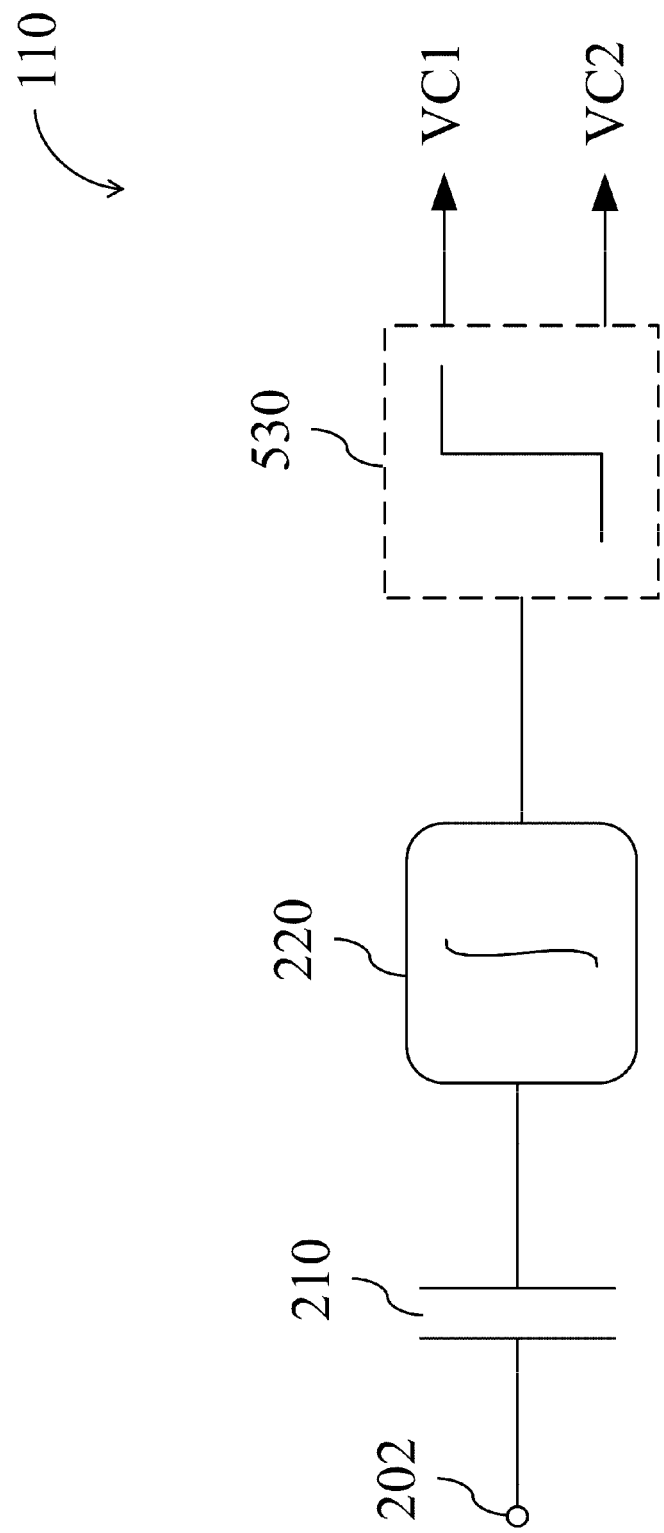
FIG. 5 is a simplified functional block diagram of the noise detector in FIG. 1 in accordance with another example embodiment.

In the previous descriptions, the noise detector 110 utilizes the digital control codes to adjust the components in the gain amplifier 130 and the adjustable Schmitt trigger 140, but this is merely an example rather than a restriction to the practical implementations. For example, FIG. 5 shows a simplified functional block diagram of the noise detector 110 in accordance with another example embodiment. The embodiment of FIG. 5 is similar to the embodiment of FIG. 2, and the difference between the two embodiments is that the analog-to-digital converter 230 in FIG. 2 is replaced by a level shifter 530 in the embodiment of FIG. 5. As shown in FIG. 5, the level shifter 530 is coupled with the rectifier 220 to generate two control voltages VC1 and VC2 according to the rectified signal outputted from the rectifier 220.

Since the control signals outputted from the noise detector 110 in FIG. 5 are analog signals, part of the circuit structure in the gain amplifier 130 and the adjustable Schmitt trigger 140 should be correspondingly adjusted so as to operate with the embodiment of FIG. 5.

Figure 6:
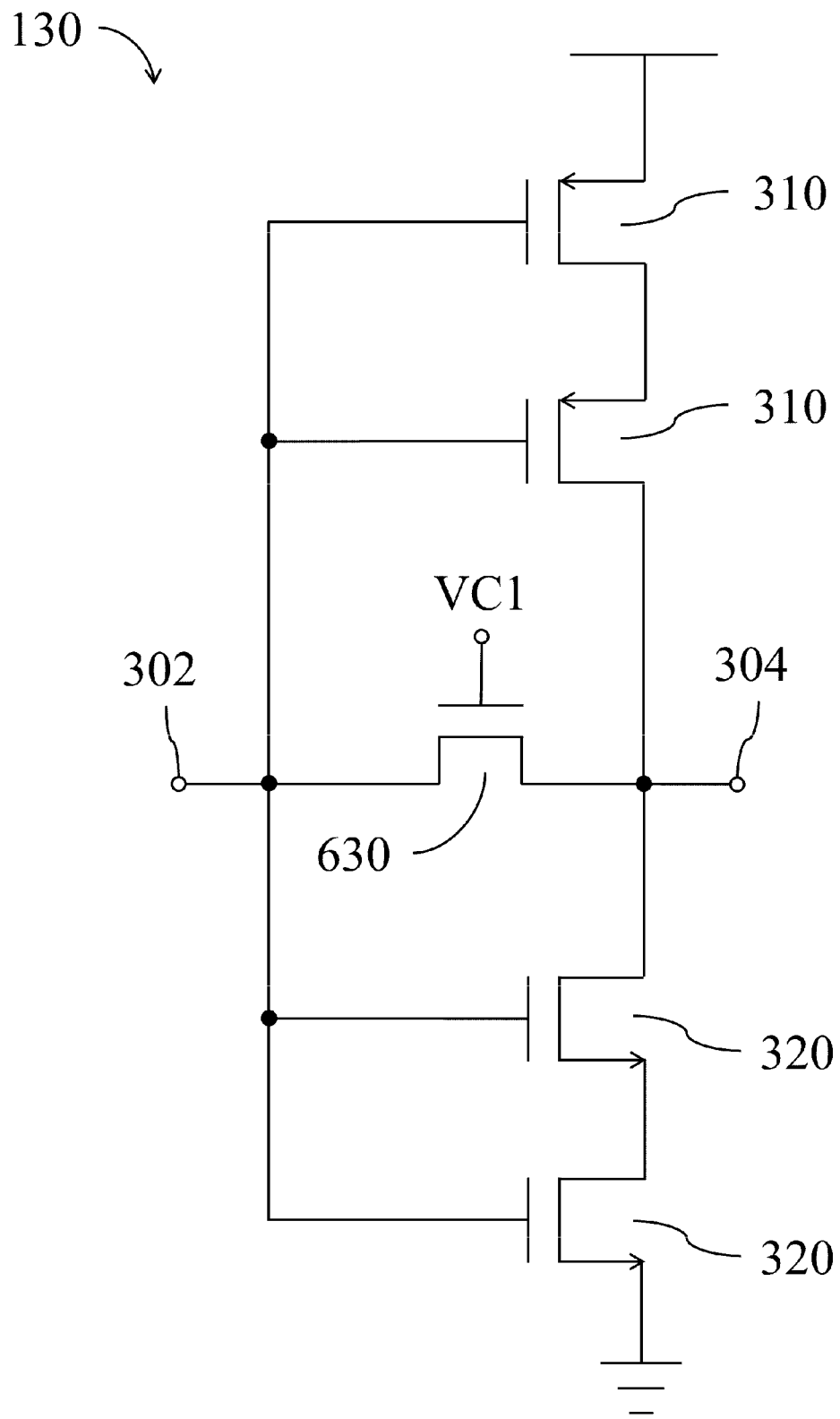
FIG. 6 is a simplified functional block diagram of the gain amplifier in FIG. 1 in accordance with another example embodiment.

FIG. 6 is a simplified functional block diagram of the gain amplifier 130 in accordance with another example embodiment. In this embodiment, the gain amplifier 130 comprises an input terminal 302, an output terminal 304, a plurality of serially-connected transistors 310, a plurality of serially-connected transistors 320, and a transistor 630. As shown in FIG. 6, the transistor 630 is coupled between the input terminal 302 and the output terminal 304, and control terminal of the transistor 630 is coupled with the control voltage VC1 generated by the noise detector 110. Components having the same reference numbers in FIG. 6 and FIG. 3 have the same connection relationship, and thus the previous descriptions regarding other components in FIG. 3 are also applicable in the embodiment of FIG. 6.

In operations, the noise detector 110 utilizes the control voltage VC1 to control the equivalence resistance of the transistor 630 in the gain amplifier 130 to change the gain of the gain amplifier 130.

Figure 7:
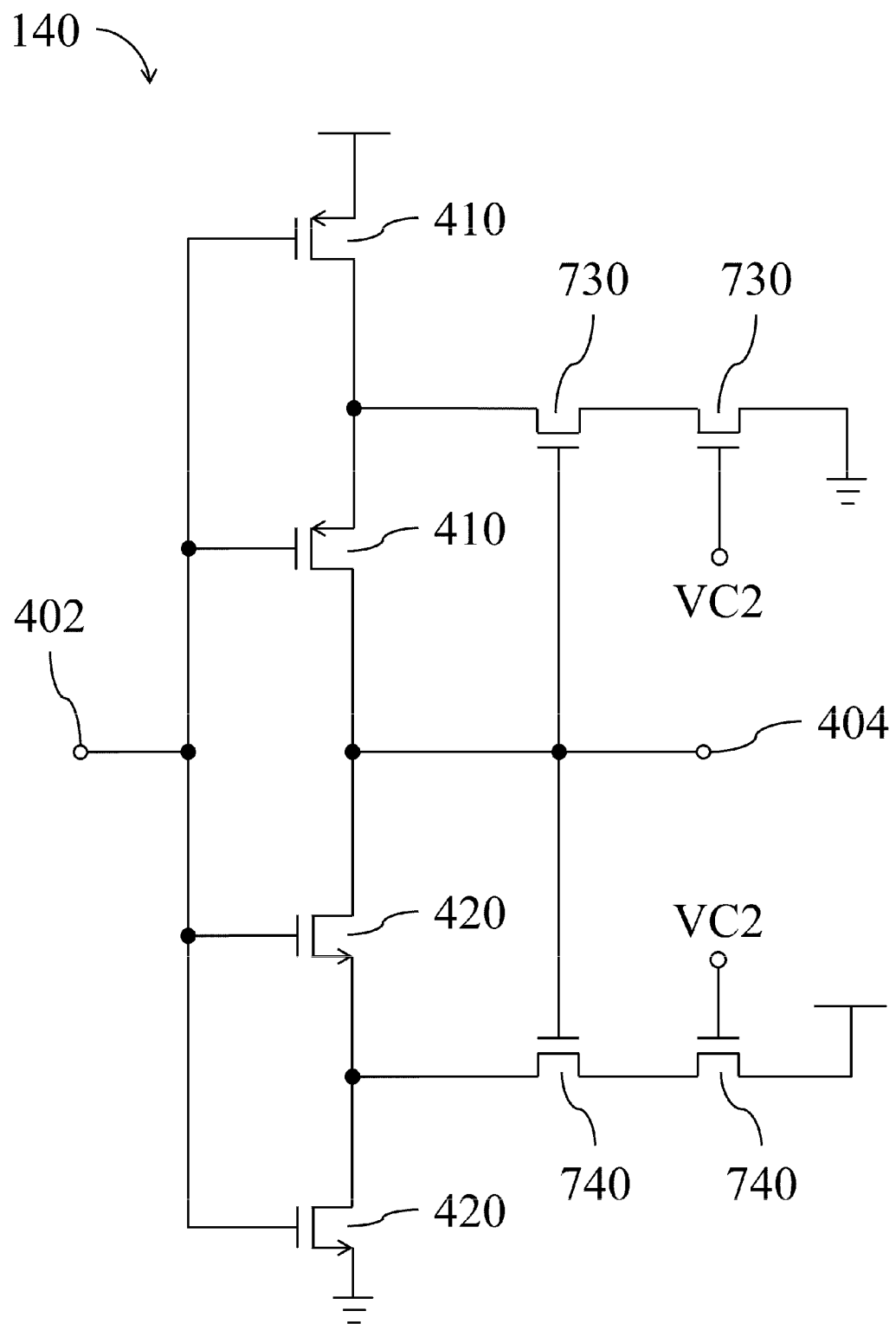
FIG. 7 is a simplified functional block diagram of the adjustable Schmitt trigger in FIG. 1 in accordance with another example embodiment.

FIG. 7 is a simplified functional block diagram of the adjustable Schmitt trigger 140 in accordance with another example embodiment. In this embodiment, the adjustable Schmitt trigger 140 comprises an input terminal 402, an output terminal 404, a plurality of serially-connected transistors 410, a plurality of serially-connected transistors 420, a plurality of serially-connected transistors 730, and a plurality of serially-connected transistors 740. As shown in FIG. 7, the transistors 730 are coupled with one of the transistors 410, and a control terminal of one of the transistors 730 is coupled with the output terminal 404, and a control terminal of another transistor 730 is coupled with the control voltage VC2 generated by the noise detector 110. The transistors 740 are coupled with one of the transistors 420 and a control terminal of one of the transistors 740 is coupled with the output terminal 404, and a control terminal of another transistor 740 is coupled with the control voltage VC2. Components having the same reference numbers in FIG. 7 and FIG. 4 have the same connection relationship, and thus the previous descriptions regarding other components in FIG. 4 are also applicable in the embodiment of FIG. 7.

In operations, the noise detector 110 utilizes the control voltage VC2 to control one of the transistors 730 and one of the transistors 740 in the adjustable Schmitt trigger 140 to adjust the size of the hysteresis window of the adjustable Schmitt trigger 140.

In one embodiment, when the noise detector 110 detects that the noise level of the voltage source terminal or the grounded terminal decreases, the noise detector 110 adjusts the control voltage VC2 to reduce the hysteresis window of the adjustable Schmitt trigger 140 and adjusts the control voltage VC1 to reduce the gain of the gain amplifier 130. In the contrary, when the noise detector 110 detects that the noise level of the voltage source terminal or the grounded terminal increases, the noise detector 110 adjusts the control voltage VC2 to enlarge the hysteresis window of the adjustable Schmitt trigger 140 and adjusts the control voltage VC1 to increase the gain of the gain amplifier 130 so as to improve the response speed of the overall circuit.

Similar to the previous embodiment, since the noise detector 110 in FIG. 5 dynamically adjusts the gain of the gain amplifier 130 in FIG. 6 and the size of the hysteresis window of the adjustable Schmitt trigger 140 in FIG. 7 according to the noise level of the voltage source terminal or the grounded terminal, the swing and duty cycle of the clock signal outputted from the output buffer 150 would not be affected by the noise of the voltage source terminal or the grounded terminal. In addition, it also avoids the presence of glitches in the clock signal outputted from the output buffer 150. As a result, the noise immunity capability of the adaptive clock signal generator 100 can be greatly improved without the use of the analog-to-digital converter 230 in the previous embodiment, so the circuit structure can be more compact and requires less power consumption.

In some embodiments, the afore-mentioned gain amplifier 130 may be designed to have a fixed gain. In addition, in some applications, the filter 120 may be omitted or realized by using a lower-order low-pass filter.

The afore-mentioned noise detector 110 may stop adjusting the gain amplifier 130 and/or the adjustable Schmitt trigger 140 after a predetermined period of time since the clock signal is generated by the output buffer 150 to reduce the power consumption of the adaptive clock signal generator 100.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An adaptive clock signal generator with noise immunity capability, comprising:
   a gain amplifier for processing an analog oscillation signal to generate an amplified signal;
   an adjustable Schmitt trigger, coupled with an output terminal of the gain amplifier, for generating a triggered signal according to the amplified signal;
   an output buffer, coupled with an output terminal of the adjustable Schmitt trigger, for generating a clock signal according to the triggered signal; and
   a noise detector coupled with the adjustable Schmitt trigger;
   wherein when the noise detector is coupled with a first input signal, the noise detector detects noise components of the first input signal and enlarges a hysteresis window of the adjustable Schmitt trigger as detected noise components of the first input signal increases;
   wherein the noise detector comprises:
   a capacitive device for extracting AC components of the first input signal when coupled with the first input signal;
   a rectifier, coupled with the capacitive device, for generating, a rectified signal according to an output signal of the capacitive device: and
   a level shifter, coupled with the rectifier, for generating a first control voltage and a second control voltage according to the rectified signal.

2. The adaptive clock signal generator of claim 1, wherein the noise detector stops adjusting the adjustable Schmitt trigger after a predetermined period of time since the clock signal is generated by the output buffer.

3. The adaptive clock signal generator of claim 1, further comprising:
   a filter, coupled with an input terminal of the gain amplifier, for filtering a second input signal to generate the analog oscillation signal.

4. The adaptive clock signal generator of claim 1, wherein the adjustable Schmitt trigger comprises:
   a first input terminal;

a first output terminal;
a plurality of coupled first transistors, wherein control terminals of the plurality of first transistors are coupled with the first input terminal, and one of the plurality of first transistors is coupled with the first output terminal;
a plurality of coupled second transistors, wherein control terminals of the plurality of second transistors are coupled with the first input terminal, and one of the plurality of second transistors is coupled with the first output terminal;
a plurality of first switches in parallel connections coupled with one of the plurality of first transistors;
a plurality of second switches in parallel connections coupled with one of the plurality of second transistors;
a plurality of third transistors in parallel connections respectively coupled with the plurality of first switches, and control terminals of the plurality of third transistors are coupled with the first output terminal; and
a plurality of fourth transistors in parallel connections respectively coupled with the plurality of second switches, and control terminals of the plurality of fourth transistors are coupled with the first output terminal;
wherein when noise components of the first input signal increases, the noise detector utilizes the plurality of digital control codes to control the plurality of first switches and the plurality of second switches to enlarge the hysteresis window of the adjustable Schmitt trigger.

5. The adaptive clock signal generator of claim 4, wherein the gain amplifier comprises:
a second input terminal;
a second output terminal;
a plurality of coupled fifth transistors, wherein control terminals of the plurality of fifth transistors are coupled with the second input terminal, and one of the plurality of fifth transistors is coupled with the second output terminal;
a plurality of coupled sixth transistors, wherein control terminals of the plurality of sixth transistors are coupled with the second input terminal, and one of the plurality of sixth transistors is coupled with the second output terminal;
a plurality of third switches in parallel connections respectively coupled between the second input terminal and the second output terminal; and
a plurality of resistors in parallel connections respectively coupled with the plurality of third switches;
wherein when the noise detector enlarges the hysteresis window of the adjustable Schmitt trigger, the noise detector utilizes the plurality of digital control codes to control the plurality of third switches to increase a gain of the gain amplifier.

6. The adaptive clock signal generator of claim 1, wherein the adjustable Schmitt trigger comprises:
a first input terminal;
a first output terminal;
a plurality of coupled first transistors, wherein control terminals of the plurality of first transistors are coupled with the first input terminal, and one of the plurality of first transistors is coupled with the first output terminal;
a plurality of coupled second transistors, wherein control terminals of the plurality of second transistors are coupled with the first input terminal, and one of the plurality of second transistors is coupled with the first output terminal;
a plurality of coupled third transistors coupled with one of the plurality of first transistors, wherein a control terminal of one of the third transistors is coupled with the first output terminal, and a control terminal of another third transistor is coupled with the second control voltage; and
a plurality of coupled fourth transistors coupled with one of the plurality of second transistors, wherein a control terminal of the fourth transistors is coupled with the first output terminal, and a control terminal of another fourth transistor is coupled with the second control voltage.

7. The adaptive clock signal generator of claim 6, wherein the gain amplifier comprises:
a second input terminal;
a second output terminal;
a plurality of coupled fifth transistors, wherein control terminals of the plurality of fifth transistors are coupled with the second input terminal, and one of the plurality of fifth transistors is coupled with the second output terminal;
a plurality of coupled sixth transistors, wherein control terminals of the plurality of sixth transistors are coupled with the second input terminal, and one of the plurality of sixth transistors is coupled with the second output terminal; and
a seventh transistor coupled between the second input terminal and the second output terminal, and a control terminal of the seventh transistor is coupled with the first control voltage.

8. The adaptive clock signal generator of claim 1, wherein the first input signal is transmitted from a voltage source terminal or a grounded terminal.

* * * * *